United States Patent [19]
Baker

[11] Patent Number: 5,793,238
[45] Date of Patent: Aug. 11, 1998

[54] RC DELAY WITH FEEDBACK

[75] Inventor: William G. Baker, Starkville, Miss.

[73] Assignee: Cypress Semiconductor Corp., San Jose, Calif.

[21] Appl. No.: 743,005

[22] Filed: Nov. 1, 1996

[51] Int. Cl.[6] .................................................. H03K 5/13
[52] U.S. Cl. ........................ 327/262; 327/284; 327/288
[58] Field of Search ................................. 327/262, 263, 327/264, 271, 272, 276, 278, 281, 284, 285, 288, 268, 283, 290, 362, 363, 261

[56] References Cited

U.S. PATENT DOCUMENTS

| | | | |
|---|---|---|---|
| 4,359,649 | 11/1982 | Mundel | 327/263 |
| 4,644,182 | 2/1987 | Kawashima et al. | 327/263 |
| 4,812,687 | 3/1989 | Larson et al. | 327/263 |
| 5,191,245 | 3/1993 | Kang | 327/262 |
| 5,548,237 | 8/1996 | Iadanza et al. | 327/277 |
| 5,572,159 | 11/1996 | McFarland | 327/276 |

FOREIGN PATENT DOCUMENTS

| | | | |
|---|---|---|---|
| 0176214 A1 | 4/1986 | European Pat. Off. | 327/263 |
| 63-48008 | 2/1988 | Japan | 327/285 |
| 4-129321 | 4/1992 | Japan | 327/285 |

OTHER PUBLICATIONS

Hiroshi Sakamoto, "Timing Generator", Motorola Technical Developments, vol. 6, p. 26–27, Oct. 1986.

*Primary Examiner*—Timothy P. Callahan
*Assistant Examiner*—Eunja Shin
*Attorney, Agent, or Firm*—Maiorana & Acosta, P.C.

[57] ABSTRACT

The present invention concerns a delay circuit that provides a fixed amount of delay that is generally independent of process variations. An input resistance is provided that may be presented to a threshold device, such as an inverter, that may then be presented as an output. The output of the threshold device may also be presented through a feedback path comprising a capacitive device to the input of the threshold device. The feedback through the capacitive load actively resists the movement of the load. As a result, the delay provided by the circuit is generally resistant to process variations.

18 Claims, 2 Drawing Sheets

RC DELAY WITH FEEDBACK

FIELD OF THE INVENTION

The present invention relates to delay circuits generally and, more particularly, to an RC delay circuit with a feedback.

BACKGROUND OF THE INVENTION

RC delay circuits are used to provide a predetermined amount of delay for use in circuit applications. The amount of delay that can be realized is a function of both the amount of resistance as well as the amount of capacitance in the RC network. During the fabrication of an integrated circuit (IC), certain components may realize a fairly substantial amount of error from the targeted values due to process variations. The fabrication error in implementing resistors is fairly accurate (e.g., within 10–20%), while the fabrication error in implementing transistors may be fairly large (e.g., up to 50% in some cases).

One application where an accurate delay would be desirable is a memory circuit that has a requirement for zero data hold at the end of a write. A user may have the ability to take away the write control signal and change the data on the pins at the same time. The speed of changing the data to writing the cell is much faster than stopping the writing. If the write signal were removed and the data was changed simultaneously, the data may be corrupted because the changed data may be written into the cell. By placing a delay path in the data, if the data changes at the same time the write is disabled, the write is disabled internally before the delayed data has changed. In such an application, there is a delayed window that needs to be hit. If there is not enough delay, corrupted data may result. If there is too much delay, another circuit specification may be violated. If the parameters on a particular part where the delay is implemented have wide supply voltage tolerances, existing delay elements that are susceptible to process variations may not provide the delay control required.

SUMMARY OF THE INVENTION

The present invention concerns a delay circuit that provides a fixed amount of delay that is generally independent of process variations. An input resistance is provided that may be presented to a threshold device, such as an inverter, that may then be presented as an output. The output of the threshold device may also be presented through a feedback path comprising a capacitive device to the input of the threshold device. The feedback through the capacitive load actively resists the movement of the load. As a result, the delay provided by the circuit is generally resistant to process variations.

The objects, features and advantages of the present invention include a delay circuit that provides a fixed delay that is generally independent of process variations, may be implemented using relatively simple components, provides the required delay generally independently of variations in the input supply voltage, provides fast process corner performance and is able to compensate for increased speed of other devices and the circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
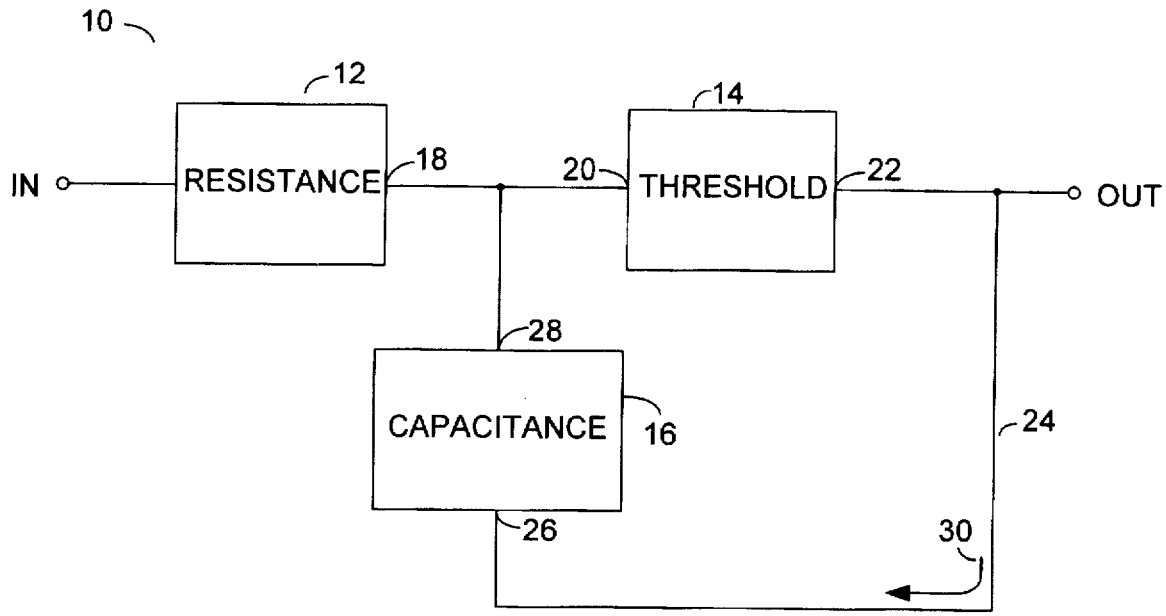
FIG. 1 is a block diagram of the preferred embodiment of the present invention.

Referring to FIG. 1, a block diagram of a circuit 10 is shown in accordance with a preferred embodiment of the present invention. The circuit 10 generally comprises a resistor block 12, a threshold block 14 and a capacitive block 16. The resistance block 12 has an input 13 that may receive a signal IN and an output 18 that may be presented to an input 20 of the threshold block 14. The threshold block 14 has an output 22 that may present a signal OUT. The signal OUT may also be presented to a feedback path 24 that may be presented to an input 26 of the capacitance block 16. The capacitance block 16 has an output 28 that is generally presented to the input 20 of the threshold block 14.

The resistance provided by the resistance block 12, in combination with the capacitance provided by the capacitance block 16, determines the delay provided by the circuit 10 between the signal IN and the signal OUT. The feedback path 24 generally provides a positive feedback in the direction of the arrow 30. The feedback provided by the feedback path 24 actively resists the movement of the load. As a result, the circuit 10 provides a predetermined delay that is generally independent of process variations that may be encountered during fabrication of the circuit 10.

The resistance block 12 may be implemented as any type of device which provides a fixed resistance. The threshold device 14 may be implemented as any device that requires a predetermined threshold value at an input before providing an output. Examples of such threshold devices include an inverter, a Schmitt trigger or any other type of threshold triggered device. The path from the output 22 of the threshold device 14, through the feedback path 24, the capacitive block 16 and back to the input 20 of the threshold block 14 should generally provide positive feedback for proper operation of the circuit 10. As a result, the resistance block 12, the threshold block 14 and the capacitance block 16 should generally be designed accordingly. The ratio of the capacitance from the capacitance block 16 and the resistance from the resistance block 12 determines the delay from the signal IN to the signal OUT.

Figure 2:
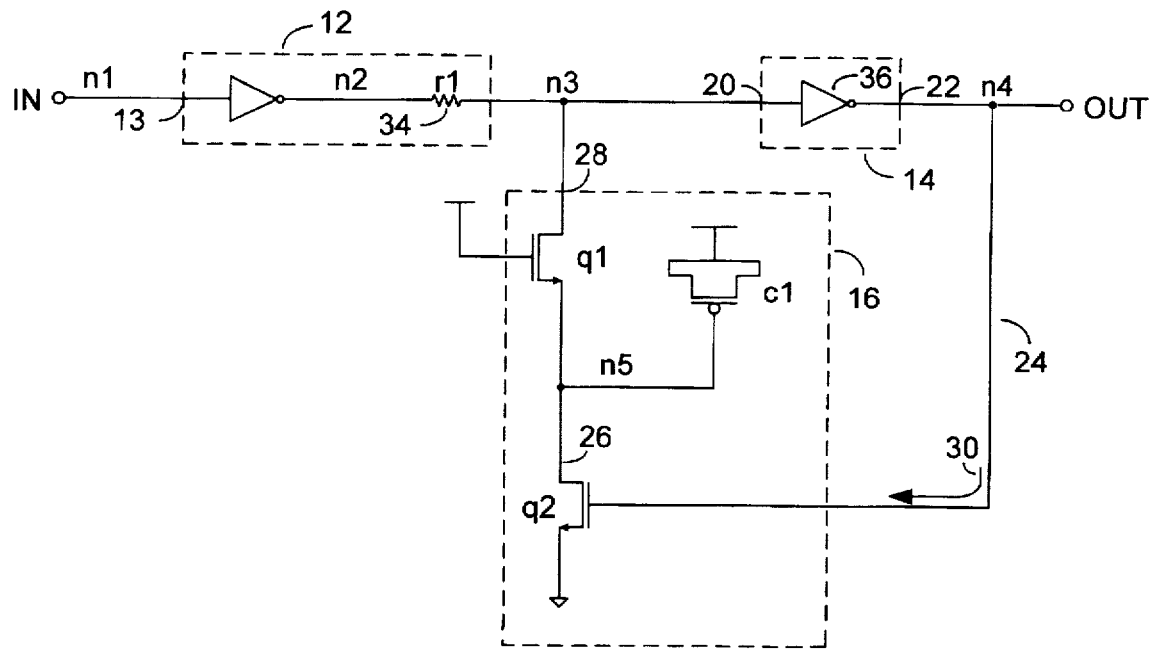
FIG. 2 is a circuit diagram illustrating the embodiment of FIG. 1.

Referring to FIG. 2, the circuit 10 is shown in more detail. The signal IN is generally represented as a node N1 that is generally presented to the input 13 of the resistance block 12. The resistance block 12 generally comprises an inverter 32 and a resistor 34. The inverter 32 acts as a driver circuit for the resistor 34. A node N2 represents a signal between the inverter 32 and the resistor 34. The output 18 and the output 28 are generally represented as a node N3 that may be presented to the input 20 of the threshold block 14. The threshold block 14 is generally shown comprising an inverter 36. When the threshold block 14 is implemented as an inverter 36, the inverter 32 is generally used to maintain the polarity between the signal IN and the signal OUT. A node N4 generally represents the signal OUT that may be presented through the feedback path 24. The inverter 36 also compensates for the polarity inversion across the gate to drain junction of the transistor Q2. As such, the feedback path 24 is generally maintained as positive feedback.

The capacitance block 16 is shown to be generally comprised of a transistor Q1, a transistor Q2 and a capacitor C1. The transistor Q2 is generally implemented between the node N4 and the input 26. The transistor Q2 has a gate that may receive the signal from the feedback path 24. The source and drain of the transistor Q2 are generally cascaded between the input 26 and ground. A node N5 represents a signal between the capacitor C1 and the source of the transistor Q1. The capacitor C1 is generally coupled to a supply voltage, such as an input supply voltage VCC. However, the capacitor C1 may be connected to another supply voltage according to the design criteria of a particular application. In one example, the capacitor C1 may be implemented as a PMOS device connected to the input power supply VCC. Such an implementation maximizes the capacitance on node N5 even at low voltages which improves the overall functioning of the circuit 10. In another example, the capacitor C1 may be implemented as an NMOS device that may be pulled up from ground. However, an NMOS implementation of the capacitor C1 may provide less desirable results. The transistor Q1 may be implemented as a pass transistor.

During normal operation of the circuit 10, the transistor Q2 actively pulls down on the node N5 as the node N3 rises. As a result, the delay increases between the input IN and the output OUT without significantly increasing the die area.

Figure 3:
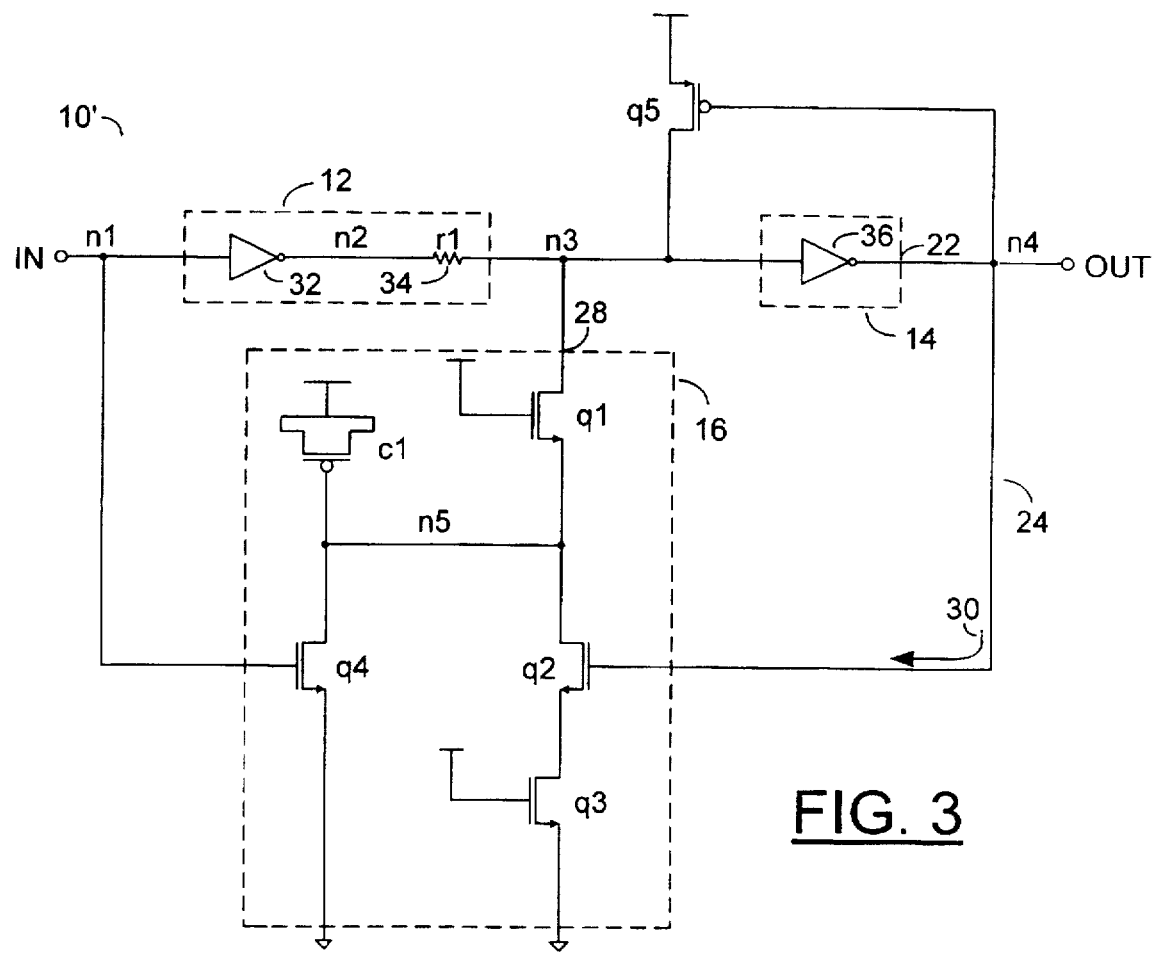
FIG. 3 is a more detailed circuit diagram illustrating the implementation of additional circuitry.

Referring to FIG. 3, an alternate implementation circuit 10' is shown. The alternate implementation circuit 10' adds additional transistors Q3, Q4 and Q5. In one implementation of the circuit 10', the transistors Q2 and Q3 may be implemented as MOS transistors. However, other topologies may be used to meet the design criteria of a particular application. The addition of transistor Q3 reduces the positive feedback through the feedback loop 24. It is a general design criteria to implement the circuit 10' using a minimum amount of real estate. The addition of the transistor Q3 reduces the overall size of the circuit 10'. The feedback effect of the transistor Q2 is generally weakened by transistor Q3. The transistor Q3 is implemented in combination with the transistor Q2 rather than making the transistor Q2 a very weak device. If the transistor Q2 is implemented as a weak device, a large gate capacitance would result which may load the output node N4. As a result of the transistor Q3 weakening the feedback through the feedback path 24, the output OUT has a delay, but maintains a fast edge transition.

The transistor Q3 may be coupled between the transistor Q2 and ground. The transistor Q4 may be coupled between the node N5 and ground. The gate of the transistor Q4 may be coupled to the node N1. The source and drain of the transistor Q5 may be coupled between the node N3 and an input supply voltage VCC. The gate of the transistor Q5 may be coupled to the node N4.

The transistors Q1 and Q2, along with the transistor Q3, must be designed such that the voltage at the node N3 remains above the threshold voltage required for proper operation of the threshold block 14. The transistor Q4 ensures the circuit 10' is reset properly to maintain an accurate delay. The transistor Q5 ensures a fast transition on the output node. The transistor Q2 is designed to be a minimum sized device such that the transistor Q1 and the transistor Q3 provide the desired delay independent of processing variations. For example, at faster processing, the delay is longer and generally provides adequate compensation for the process. This results in an overall consistent delay between the signal IN and the signal OUT.

When the node N1 is high, the transistor Q4 generally ensures that the node N5 begins low, the node N3 begins low and the node N4 begins high. When the node N1 falls, the node N2 quickly rises and the node N3 begins to rise. The faster the MOS transistors Q1 operates at a given process corner, the lower the resistance between the node N3 and the node N5. Additionally, a greater perceived capacitance is generally realized at the node N3. The faster the process corner, the more the transistor Q2 and the transistor Q3 pulldown the node N5. Both of these effects (i.e., increased capacitance at node N3 and greater pulldown of the node N5) slow down the rise of the node N3 at fast process corners. The transistor Q5, which is shown generally to be implemented as a PMOS transistor, generally reduces the current (i.e., crow bar current) of the inverter 36. The transistor Q3, which is shown generally to be implemented as an NMOS transistor, weakens the feedback provided by the transistor Q2 without loading the node N4. The implementation of the transistor Q3 reduces a situation where a excessive feedback may cause the circuit 10' to malfunction. The faster the process, the greater the feedback. The transistor Q2 provides feedback for actively pulling node N5 low.

By adjusting the relative sizes of the resistor R1, the capacitor C1, the transistor Q1, the transistor Q2 and the transistor Q3, the delay between the node N1 and the node N4 may be realized almost independently of process and input supply voltage variations. The adjustment may also be implemented such that the delay is greatest during fast process corners, which allows for compensation due to increased speed of other circuits. Maximum resistances and the maximum capacitances may be used to create the maximum delay while using the smallest area. By adding the transistor Q3, the ratio of the resistances between the resistor R1 and transistor Q1 depends on processing variations. The stronger transistor Q1, the more load that may be seen at the node N3. By choosing the appropriate values for the resistor R1 and transistor Q1, the delay may be realized essentially independent of processing. The addition of the transistor Q5 may reduce the amount of current that is used by the circuit 10'. The transistor Q3 allows the resistor R1 and the transistors Q1 and Q2 to be implemented as small devices.

Figure 4:
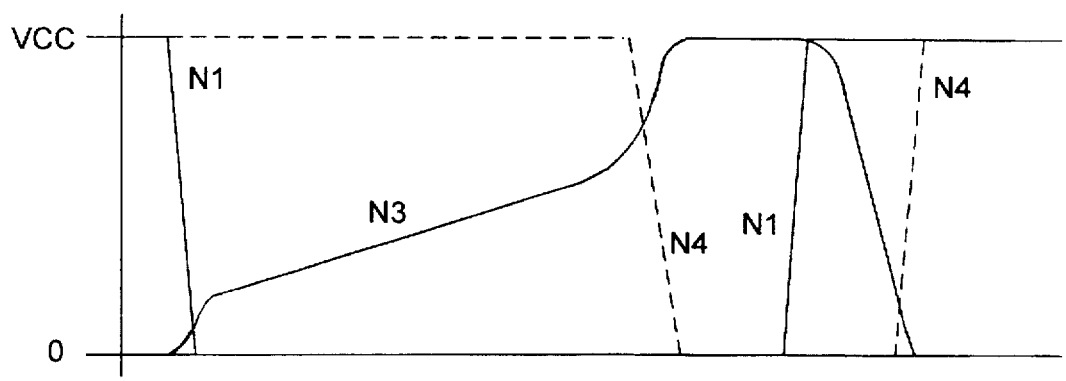
FIG. 4 is a timing diagram illustrating the transitions of the various nodes of the circuit of FIG. 3.

Referring to FIG. 4, a timing diagram of the circuit 10 is shown. As the node N1 falls, the node N3 begins to rise. After the node N1 begins to rise again, the node N3 begins to fall. The node N4 is shown to drop after the node N1 drops, which indicates a portion of the delay realized by the circuit 10. The node N4 is shown to rise slightly after the node N1 rises, which indicates another portion of the delay realized by the circuit 10.

While the invention has been particularly shown and described with reference to preferred embodiments thereof, it will be understood by those skilled in the art that various changes in form and details may be made without departing from the spirit and scope of the invention.

I claim:

1. A circuit for providing a delay between an input and an output comprising:

a resistance circuit receiving said input;

a threshold circuit configured to present said output in response to a threshold input received from said resistance circuit, wherein said output is delayed from said input; and a capacitance circuit comprising a first transistor having a gate configured to receive said output of said threshold circuit, a second transistor coupled between said first transistor and said threshold circuit, and a third transistor coupled between said first and second transistors and ground, said capacitance circuit configured to present a feedback output to the threshold circuit.

2. The circuit according to claim 1 wherein said capacitance circuit creates a positive feedback between said output of said threshold circuit and said feedback output.

3. The circuit according to claim 1 wherein said resistance circuit comprises a resistor.

4. The circuit according to claim 1 wherein said resistance circuit comprises: (i) a driver and (ii) a resistor.

5. The circuit according to claim 1 wherein said threshold circuit comprises an inverter.

6. The circuit according to claim 1 wherein the threshold circuit comprises a Schmitt trigger.

7. The circuit according to claim 1 wherein said third transistor is configured as a capacitor.

8. The circuit according to claim 1 comprising:

a fourth transistor coupled between said capacitance circuit and ground; and a fifth transistor coupled between said output of said threshold circuit and said threshold input.

9. The circuit according to claim 1 wherein:

said first transistor and said second transistor are NMOS transistors; and said third transistor is a PMOS transistor.

10. The circuit according to claim 8 wherein:

said third transistor reduces said feedback;

said fourth transistor maintains an accurate delay at said output; and said fifth transistor maintains a fast edge transition at said output.

11. A circuit for providing a delay between an input and an output comprising:

means for providing a resistance and for receiving said input;

means for providing said output in response to a threshold input from said resistance means, wherein said output is delayed from said input; and means for providing a capacitance comprising a first transistor having a gate configured to receive said output, a second transistor coupled between said first transistor and said output threshold means, and a third transistor coupled between said first and second transistors and ground, said capacitance means having: (i) a feedback output presented to said output threshold means and (ii) a feedback input received from said output threshold means.

12. The circuit according to claim 11 wherein said capacitance means creates a positive feedback between said feedback input and said feedback output.

13. The circuit according to claim 11 wherein said third transistor is configured as a capacitor.

14. The circuit according to claim 11 wherein said output threshold means is selected from the group consisting of an inverter, a Schmitt trigger and a threshold triggered device.

15. A method for providing a delay between an input and an output comprising the steps of:

(A) passing said input through a resistance until a threshold voltage is applied to a threshold circuit;

(B) presenting said output from said threshold circuit in response to said threshold voltage and a first transistor having a gate configured to receive said output from said threshold circuit, a second transistor coupled between said first transistor and said threshold circuit and a third transistor coupled between said first and second transistors and ground; and (C) coupling said output to said threshold circuit, wherein said output is delayed from said input.

16. The method according to claim 15 wherein step (C) further comprises:

increasing the speed of an edge transition of said output.

17. The method according to claim 15 wherein step (B) further comprises:

reducing said feedback to a level above said threshold circuit input.

18. The method according to claim 15 wherein step (C) further comprises:

generating a capacitance at said threshold circuit input in response to said third transistor.

* * * * *